United States Patent
Ahn et al.

(10) Patent No.: US 8,058,132 B2
(45) Date of Patent: Nov. 15, 2011

(54) METHOD OF FABRICATING FLASH MEMORY DEVICE

(75) Inventors: Myung-Kyu Ahn, Icheon-si (KR); In No Lee, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 678 days.

(21) Appl. No.: 11/965,155

(22) Filed: Dec. 27, 2007

(65) Prior Publication Data

US 2009/0104763 A1 Apr. 23, 2009

(30) Foreign Application Priority Data

Oct. 18, 2007 (KR) .................. 10-2007-0105076

(51) Int. Cl.
*H01L 21/336* (2006.01)
(52) U.S. Cl. ......... 438/299; 257/E21.294; 257/E21.438; 257/E21.624; 257/E21.685; 438/682; 438/692
(58) Field of Classification Search .................. 438/299; 257/E21.294
See application file for complete search history.

(56) References Cited

U.S. PATENT DOCUMENTS

| | | | |
|---|---|---|---|
| 5,710,454 A * | 1/1998 | Wu | 257/413 |
| 6,074,915 A | 6/2000 | Chen et al. | |
| 6,074,956 A * | 6/2000 | Yang et al. | 438/721 |
| 6,287,916 B1 * | 9/2001 | Mehta | 438/257 |
| 2005/0098821 A1 * | 5/2005 | Chao et al. | 257/314 |
| 2006/0134916 A1 * | 6/2006 | Prince et al. | 438/692 |
| 2007/0004105 A1 | 1/2007 | Nam | |
| 2008/0085591 A1 * | 4/2008 | Gomez et al. | 438/585 |
| 2008/0254607 A1 * | 10/2008 | Plat et al. | 438/594 |

FOREIGN PATENT DOCUMENTS

| | | |
|---|---|---|
| KR | 1020010066110 A | 7/2001 |
| KR | 1020070002837 A | 1/2007 |
| KR | 1020070068647 A | 7/2007 |

OTHER PUBLICATIONS

Quirk, Michael and Serda, Julian; "Semiconductor Manufacturing Technology"; 2001; Prentice-Hall, Inc.; Chapter 16; pp. 435-474.*

* cited by examiner

*Primary Examiner* — Stephen W Smoot
*Assistant Examiner* — Vicki B Booker
(74) *Attorney, Agent, or Firm* — Marshall, Gerstein & Borun LLP

(57) ABSTRACT

The present disclosure relates to a method of fabricating a flash memory device. According to the present disclosure, a hard mask layer to which surface roughnesses have been transferred by a metal silicide layer, including the surface roughness, is polished before or during a gate etch process in order to diminish the surface roughnesses. Thus, although surface roughnesses exist in the metal silicide layer, a SAC nitride layer formed over a gate can be prevented from being lost in a subsequent polishing process of a pre-metal dielectric layer, which is performed in order to form a contact plug. Accordingly, a hump phenomenon of a transistor can be improved.

72 Claims, 11 Drawing Sheets

METHOD OF FABRICATING FLASH MEMORY DEVICE

CROSS-REFERENCES TO RELATED APPLICATIONS

The priority of Korean patent application number 10-2007-105076, filed on Oct. 18, 2007, is hereby claimed and the disclosure thereof is incorporated by reference herein in its entirety.

BACKGROUND OF THE INVENTION

The present invention relates to a method of fabricating a flash memory device and, more particularly, to a method of fabricating a flash memory device which can improve a hump characteristic of a transistor.

Semiconductor memory devices for storing data can be largely classified into volatile memory devices and non-volatile memory devices. The volatile memory devices lose stored data in the absence of electrical power, whereas non-volatile memory devices maintain stored data even though the supply of power is stopped.

The non-volatile memory device includes a flash memory device. A structure, including a tunnel dielectric layer, a floating gate, a dielectric layer and a control gate formed over an active region of a semiconductor substrate, has generally been adopted as a unit cell of the flash memory device.

In general, in forming the gate of the flash memory device, the control gate is formed of a stacked structure of a polysilicon layer and a tungsten silicide (WSix) layer. In a process of forming the tungsten silicide layer, surface roughness is generated, causing a step. The surface roughness generated in the process of forming the tungsten silicide layer is transferred to a hard mask layer, which is subsequently formed on the tungsten silicide layer, and also to a Self-Aligned Contact (SAC) nitride layer formed on the gate surface in order to protect the gate at the time of a polishing process of a pre-metal dielectric layer for forming a contact plug after the gate is etched. Consequently, a step is generated in regions in which the surface roughness has occurred.

Due to this, in the polishing process of the pre-metal dielectric layer for forming the contact plug, the SAC nitride layer formed in the region in which the surface roughness has occurred is lost. Thus, during a subsequent process, impurities such as hydrogen ($H_2$) are infiltrated into the bottom of the gate through the lost portion of the SAC nitride layer, degrading the tunnel dielectric layer. Accordingly, a transistor hump phenomenon, such as that the leakage current is generated in the transistor, are generated due to the degradation of the tunnel dielectric layer. The hump phenomenon has an effect on the transistor, causing well stress fail and therefore reducing the yield.

BRIEF SUMMARY OF THE INVENTION

The present invention is directed towards a method of fabricating a flash memory device, in which it can improve a hump characteristic of a transistor by preventing the loss of a SAC nitride layer formed on a gate at the time of a polishing process of a pre-metal dielectric layer, for forming a subsequent contact plug, although surface roughnesses exists in a metal silicide layer.

A method of fabricating a flash memory device according to a first embodiment of the present invention includes providing a semiconductor substrate in which a tunnel dielectric layer, a first conductive layer, a dielectric layer, a second conductive layer, a metal silicide layer and a hard mask layer are sequentially formed, patterning the hard mask layer, the metal silicide layer, the second conductive layer and the dielectric layer, patterning the first conductive layer while polishing the hard mask layer in order to diminish surface roughnesses generated in the hard mask layer, forming a Self-Aligned Contact (SAC) nitride layer and a pre-metal dielectric layer over a gate pattern including the polished hard mask layer, and performing an etch process for polishing the pre-metal dielectric layer.

In the first embodiment, the hard mask layer may have a stacked structure of an oxide layer, an amorphous carbon layer and a silicon oxynitride layer. The first conductive layer may be patterned through a plasma etch process of a main etch process and an overetch process. The main etch process may include a first process using a bias power of 200 to 1500 W and a second process using a bias power of 100 to 700 W. The overetch process may be performed using a bias power of 100 to 700 W. The hard mask layer may be polished in the first process of the main etch process. The amorphous carbon layer may be removed in-situ or ex-situ after the dielectric layer may be patterned.

A method of fabricating a flash memory device according to a second embodiment of the present invention includes providing a semiconductor substrate in which a tunnel dielectric layer, a first conductive layer, a dielectric layer, a second conductive layer, a metal silicide layer and a hard mask layer are sequentially formed, patterning the hard mask layer, patterning the metal silicide layer, the second conductive layer, the dielectric layer and the first conductive layer while polishing the hard mask layer in order to diminish surface roughnesses generated in the hard mask layer, forming a SAC nitride layer and a pre-metal dielectric layer over a gate pattern including the polished hard mask layer, and performing an etch process for polishing the pre-metal dielectric layer.

In the second embodiment, the hard mask layer may have a stacked structure of an oxide layer, an amorphous carbon layer and a silicon oxynitride layer. The oxide layer may be formed to a thickness of 500 to 4000 angstrom. The amorphous carbon layer may be removed in-situ or ex-situ after the hard mask layer may be patterned.

A method of fabricating a flash memory device according to a third embodiment of the present invention includes providing a semiconductor substrate in which a tunnel dielectric layer, a first conductive layer, a dielectric layer, a second conductive layer, a metal silicide layer and a hard mask layer are sequentially formed, patterning the hard mask layer and the metal silicide layer, patterning the second conductive layer, the dielectric layer and the first conductive layer while polishing the hard mask layer in order to diminish surface roughnesses generated in the hard mask layer, forming a SAC nitride layer and a pre-metal dielectric layer over a gate pattern including the polished hard mask layer, and performing an etch process for polishing the pre-metal dielectric layer.

In the third embodiment, the amorphous carbon layer may be removed in-situ or ex-situ after the metal silicide layer is patterned.

A method of fabricating a flash memory device according to a fourth embodiment of the present invention includes providing a semiconductor substrate in which a tunnel dielectric layer, a first conductive layer, a dielectric layer, a second conductive layer, a metal silicide layer and a hard mask layer are sequentially formed, patterning the hard mask layer, the metal silicide layer and the second conductive layer, patterning the dielectric layer and the first conductive layer while polishing the hard mask layer in order to diminish surface roughnesses generated in the hard mask layer, forming a SAC nitride layer and a pre-metal dielectric layer over a gate pattern including the polished hard mask layer, and performing an etch process for polishing the pre-metal dielectric layer.

In the fourth embodiment, the amorphous carbon layer may be removed in-situ or ex-situ after the second conductive layer is patterned.

In the third and fourth embodiments, the hard mask layer may have a stacked structure of an oxide layer, an amorphous carbon layer and a silicon oxynitride layer. The oxide layer may be formed to a thickness of 500 to 3000 angstrom.

In the first to fourth embodiments, the hard mask layer may have a stacked structure of two or more layers including a carbon-rich or oxygen-rich polymer-based material. The oxide layer may be formed from a TEOS oxide layer, a HTO layer or a HDP oxide layer.

A method of fabricating a flash memory device according to a fifth embodiment of the present invention includes providing a semiconductor substrate in which a tunnel dielectric layer, a first conductive layer, a dielectric layer, a second conductive layer, a metal silicide layer and a first hard mask layer are sequentially formed, polishing the first hard mask layer in order to diminish surface roughnesses generated in the first hard mask layer, forming second and third hard mask layers over the polished first hard mask layer, patterning the third hard mask layer, the second hard mask layer, the polished first hard mask layer, the metal silicide layer, the second conductive layer, the dielectric layer and the first conductive layer, forming a SAC nitride layer and a pre-metal dielectric layer over a gate pattern including the polished hard mask layer, and performing an etch process for polishing the pre-metal dielectric layer.

In the fifth embodiment, the first hard mask layer may be formed to a thickness of 1000 to 3000 angstrom. The first hard mask layer may be formed from an oxide layer. The second hard mask layer may be formed from an amorphous carbon layer. The third hard mask layer may be formed from a silicon oxynitride layer.

In the first to fifth embodiments, each of the first conductive layer and the second conductive layer may be formed from a polysilicon layer. The dielectric layer may have a stacked structure of an oxide layer, a nitride layer and an oxide layer (ONO).

The metal silicide layer may be formed from a tungsten silicide (WSix) layer. The tungsten silicide layer may be formed using a silicide process employing a MonoSilane (MS, $SiH_4$) or DiChloroSilane (DCS, $SiH_2Cl_2$) gas.

At the time of the patterning and when the first hard mask layer may be polished, a dry etch or wet etch etchback process may be used.

The gate pattern may be patterned using a plasma etch equipment of a Capacitively Coupled Plasma (CCP) type, an Inductively Coupled Plasma (ICP) type or a microwave plasma type.

The SAC nitride layer may be formed using a Plasma-Enhanced Chemical Vapor Deposition (PECVD) method or a Low Pressure Chemical Vapor Deposition (LPCVD) method.

The etch process of the pre-metal dielectric layer may be performed using a Chemical Mechanical Polishing (CMP) process.

The CMP process may be performed until a surface of the SAC nitride layer may be exposed or until the SAC nitride layer is not exposed.

The CMP process may be performed using a High Selectivity Slurry (HSS) having less loss of the SAC nitride layer or a Low Selectivity Slurry (LSS) having more loss of the SAC nitride layer.

Spacers may be further formed on the sidewalls of the gate pattern before the SAC nitride layer may be formed.

A method of fabricating a flash memory device according to another embodiment of the present invention includes forming a hard mask layer over a semiconductor substrate in which a stacked layer, including a conductive layer and a metal silicide layer, may be formed, patterning the hard mask layer and the metal silicide layer, patterning the conductive layer while polishing the hard mask layer in order to diminish surface roughnesses generated in the hard mask layer, forming a SAC nitride layer and a pre-metal dielectric layer over a gate pattern including the polished hard mask layer, and performing an etch process for polishing the pre-metal dielectric layer.

A method of fabricating a flash memory device according to still another embodiment of the present invention includes forming a hard mask layer over a semiconductor substrate in which a stacked layer, including a conductive layer and a metal silicide layer, may be formed, patterning the hard mask layer, patterning the metal silicide layer and the conductive layer while polishing the hard mask layer in order to diminish surface roughnesses generated in the hard mask layer, forming a SAC nitride layer and a pre-metal dielectric layer over a gate pattern including the polished hard mask layer, and performing an etch process for polishing the pre-metal dielectric layer.

A method of fabricating a flash memory device according to further still another embodiment of the present invention includes forming a hard mask layer over a semiconductor substrate in which a stacked layer, including a conductive layer and a metal silicide layer, may be formed, polishing the hard mask layer in order to diminish surface roughnesses generated in the hard mask layer, patterning the hard mask layer, the metal silicide layer and the conductive layer, forming a SAC nitride layer and a pre-metal dielectric layer over a gate pattern including the polished hard mask layer, and performing an etch process for polishing the pre-metal dielectric layer.

In accordance with the present invention, a hard mask layer to which surface roughnesses have been transferred by a metal silicide layer, including the surface roughnesses, is polished before or during a gate etch process in order to diminish the surface roughnesses. Thus, although surface roughnesses may exist in the metal silicide layer, a SAC nitride layer formed over a gate can be prevented from being lost in a subsequent polishing process of a pre-metal dielectric layer, which is performed in order to form a contact plug. Accordingly, a hump phenomenon of a transistor can be improved.

In accordance with the present invention, a leakage current characteristic of a transistor and well stress fail can be improved by improving the hump characteristic of the transistor. Accordingly, the yield and reliability of devices can be improved.

In accordance with the present invention, a stop-on-nitride process of a CMP process of the SAC nitride layer can be secured stably. Thus, CMP uniformity with respect to a semiconductor substrate can be enhanced significantly. Accordingly, overetch margin in subsequent etch processes of a source contact, a drain contact, a metal contact, etc. can be increased.

DESCRIPTION OF SPECIFIC EMBODIMENTS

Now, specific embodiments according to the present invention will be described with reference to the accompanying drawings.

However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

FIGS. 1A to 1E are sectional views illustrating a method of fabricating a flash memory device according to a first embodiment of the present invention.

Figure 1A:
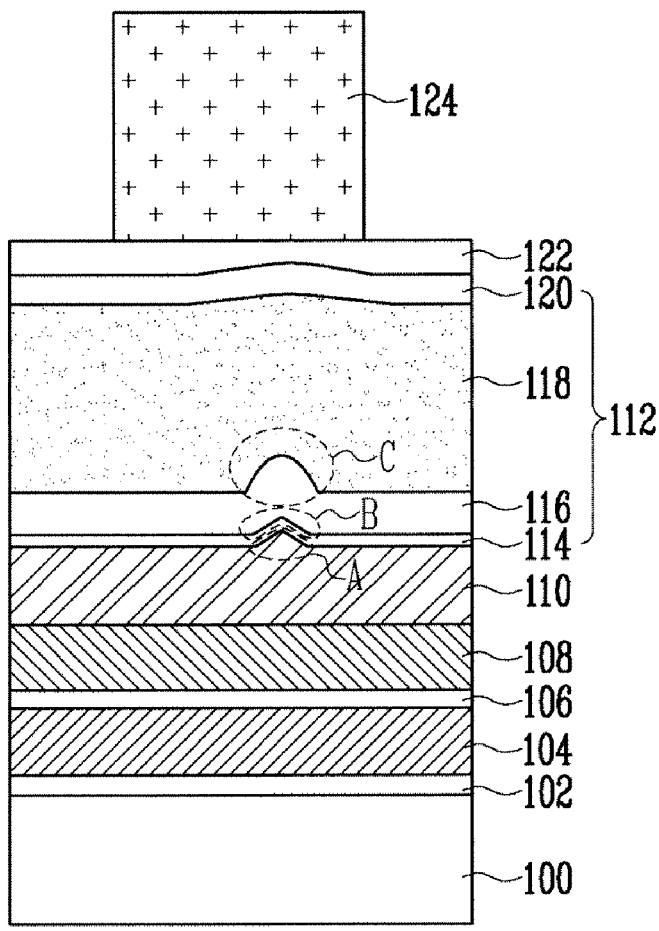
FIGS. 1A to 1E are sectional views illustrating a method of fabricating a flash memory device according to a first embodiment of the present invention.

Referring to FIG. 1A, a tunnel dielectric layer 102 and a first conductive layer 104 are formed over a semiconductor substrate 100. The tunnel dielectric layer 102 may be formed from a silicon oxide ($SiO_2$) layer using an oxidization process. The first conductive layer 104 is used as a floating gate of the flash memory device, and may be formed from a polysilicon layer, a metal layer or a stacked layer of them, preferably, a polysilicon layer.

The first conductive layer 104 of an active region is patterned in a first direction (a bit line direction) by performing an etch process employing a mask (not shown). Meanwhile, when the first conductive layer 104 in the active region is patterned, the first conductive layer 104, the tunnel dielectric layer 102 and the semiconductor substrate 100 of an isolation region are etched, thus forming trenches (not shown). An insulating material is deposited in order to gap fill the trenches and then polished, thus forming isolation layers (not shown) within the trenches. The isolation layers may be formed using an Advanced Self-Aligned Shallow Trench Isolation (ASA-STI) process.

A dielectric layer 106 and a second conductive layer 108 are then formed over the patterned first conductive layer 104 and the isolation layer. The dielectric layer 106 may be formed using a stacked structure of Oxide-Nitride-Oxide (ONO). The second conductive layer 108 is used as a control gate of the flash memory device, and may be formed from a polysilicon layer, a metal layer or a stacked layer of them, preferably, a polysilicon layer. The second conductive layer 108 is polished using an etchback process.

A metal silicide layer 110 and a hard mask layer 112 are formed over the second conductive layer 108. The metal silicide layer 110 is formed using a silicide process in order to lower the resistance of the control gate to be formed in a subsequent process, and may be formed from a tungsten silicide (WSix) layer. The tungsten silicide layer may be formed using the silicide process employing a MonoSilane (MS, $SiH_4$) or DiChloroSilane (DCS, $SiH_2Cl_2$) gas. At this time, the surface becomes rough in the process of forming the metal silicide layer 110 such as a tungsten silicide layer, so numerous roughnesses A are generated on the surface (for convenience sake, only one roughness is shown in the drawing).

The hard mask layer 112 may have a stacked structure of two or more layers including a carbon-rich or oxygen-rich polymer-based material, in order to be used as an etch barrier layer in a subsequent gate etch process. The hard mask layer 112 may have a stacked structure of a buffer nitride layer 114, an oxide layer 116, an amorphous carbon layer 118 and a silicon oxynitride (SiON) layer 120. The buffer nitride layer 114 need not be necessarily formed and may be formed from a silicon oxynitride layer. The oxide layer 116 may be formed using any kinds of oxide-based materials, such as a Tetra Ethyl Ortho Silicate (TEOS) oxide layer, a High Temperature Oxide (HTO) layer or a High Density Plasma (HDP) oxide layer. At this time, the surface roughnesses A generated in the metal silicide layer 110 are transferred, so that surface roughnesses B, C are also generated on the surfaces of the buffer nitride layer 114 and the oxide layer 116, respectively, when the buffer nitride layer 114 and the oxide layer 116 are formed. In particular, the surface has a step due to the surface roughnesses C generated in the oxide layer 116.

However, the amorphous carbon layer 118 is thickly formed compared with other layers, and therefore the surface roughnesses C generated in the oxide layer 116 are almost diminished. Thus, surface roughness of the silicon oxynitride layer 120 is diminished.

Meanwhile, an Anti-Reflective Coating (ARC) layer 122 may be further formed on the hard mask layer 112 in order to prevent total reflection of light in an exposure process when forming a photoresist pattern to be used as a gate mask in a subsequent gate etch process. A photoresist is coated on the ARC layer 122, thus forming a photoresist film. The photoresist film is exposed and developed in order to form a photoresist pattern 124.

Figure 1B:
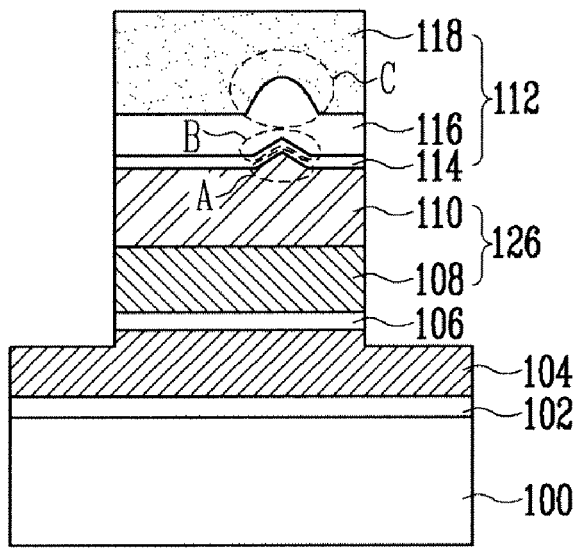

Referring to FIG. 1B, the ARC layer 122, the hard mask layer 112, the metal silicide layer 110, the second conductive layer 108 and the dielectric layer 106 are sequentially patterned in a second direction (a word line direction) by performing a primary gate etch process employing the photoresist pattern 124 as an etch mask. The primary gate etch process may be performed using a dry or wet etchback process. In the primary gate etching process, the photoresist pattern 124, the ARC layer 122, and the silicon oxynitride layer 120 of the hard mask layer 112 are all etched and removed, and the amorphous carbon layer 118 of the hard mask layer 112 is partially etched.

Further, in the primary gate etching process, the first conductive layer 104 may also be partially etched. At this time, a control gate 126 comprised of the second conductive layer 108 and the metal silicide layer 110, which are patterned after the primary gate etching, is formed.

Figure 1C:
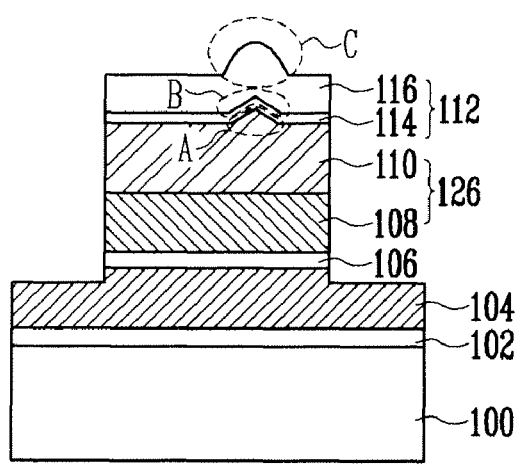

Referring to FIG. 1C, the remaining amorphous carbon layer 118 is selectively removed by performing an etch process. The amorphous carbon layer 118 may be removed in-situ or ex-situ after the primary gate etch process of patterning up to the dielectric layer 106. Accordingly, the surface of the oxide layer 116 of the hard mask layer 112 having the surface roughnesses C is exposed.

Figure 1D:
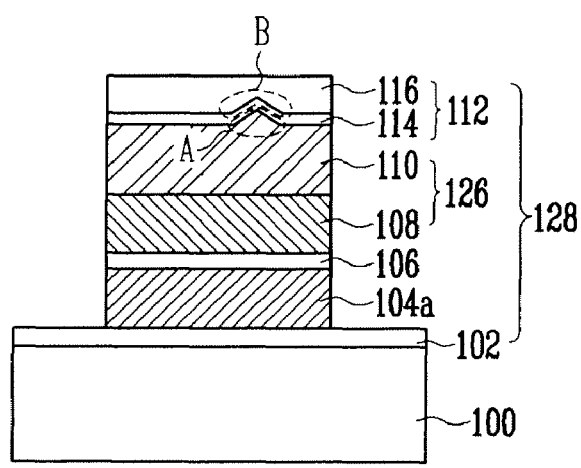

Referring to FIG. 1D, the remaining first conductive layer 104 is patterned in a second direction (a word line direction) by performing a secondary gate etch process using the oxide layer 116 as an etch mask. The surface of the oxide layer 116 of the hard mask layer 112 is polished so that the surface roughnesses C generated in the oxide layer 116 of the hard mask layer 112 while the first conductive layer 104 is patterned are diminished.

More specifically, the secondary gate etch process may be performed using a dry or wet etchback process. The first conductive layer 104 preferably is patterned through a 2-step plasma etch process including a main etch process and an overetch process. The main etch process is divided into a first process using a bias power of 200 to 1500 W and a second process using a bias power of 100 to 700 W. The overetch process is performed using a bias power of 100 to 700 W.

In order to minimize plasma damage by the underlying layer when patterning the first conductive layer 104, the surface of the oxide layer 116 of the hard mask layer 112 preferably is polished in the first process of the main etch process.

The primary and secondary gate etch processes may be performed using a plasma etch equipment of a Capacitively Coupled Plasma (CCP) type, an Inductively Coupled Plasma (ICP) type or a microwave plasma type.

Therefore, a floating gate 104a comprised of the first conductive layer 104 is formed and the surface roughnesses C generated on the surface of the oxide layer 116 are diminished, so that the surface of the oxide layer 116 is polished. A gate pattern 128, comprising the tunnel dielectric layer 102, the floating gate 104a, the dielectric layer 106, the control gate 126, the buffer nitride layer 114 and the polished oxide layer 116, is formed.

Source/drain junction regions (not shown) are then formed in the semiconductor substrate 100 at both sides of the gate pattern 128 by performing an ion implantation process, thereby completing a transistor.

Figure 1E:
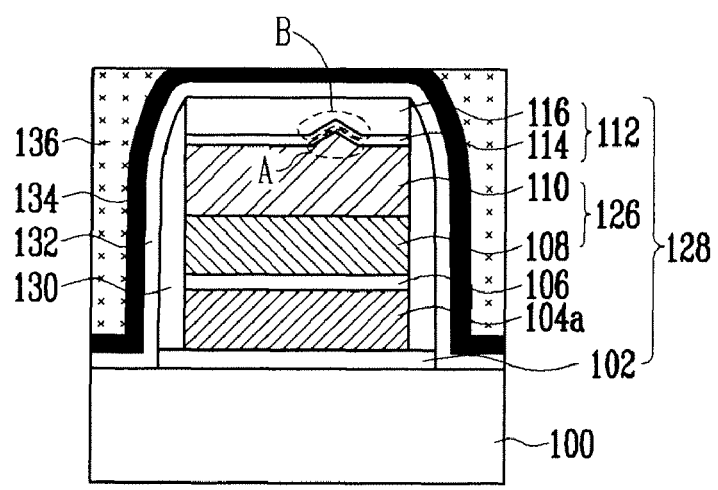

Referring to FIG. 1E, an insulating material is deposited on the gate pattern 128 including the polished oxide layer 116. Spacers 130 may be further formed on both sidewalls of the gate pattern 128 by performing a spacer etch process. When forming the spacers 130, the exposed tunnel dielectric layer 102 may be etched. Thereafter, a buffer insulating layer 132 may be further formed on the surface of the gate pattern 128 including the spacers 130.

A SAC nitride layer 134 is formed on the surface of the buffer insulating layer 132 in order to be used as a stopper during a subsequent polishing process of the pre-metal dielectric layer for forming a contact plug. The SAC nitride layer 134 may be formed from a nitride layer using a Plasma-Enhanced Chemical Vapor Deposition (PECVD) method or a Low Pressure Chemical Vapor Deposition (LPCVD) method. At this time, before the deposition of the SAC nitride layer 134, the oxide layer 116 of the hard mask layer 112 is polished. Accordingly, roughnesses are not generated on the surface of the SAC nitride layer 134.

An insulating material is then deposited on the SAC nitride layer 134, thus forming a pre-metal dielectric layer 136. The pre-metal dielectric layer 136 is etched and polished. The pre-metal dielectric layer 136 may be formed using any kinds of insulating materials, such as a TEOS oxide layer, a HTO layer and a HDP oxide layer. The polishing process may be performed using a CMP process. The polishing process may be performed until the surface of the SAC nitride layer 134 is exposed in order to improve uniformity with respect to the remaining thickness of the pre-metal dielectric layer 136. Alternatively, the polishing process may be performed until a point before the surface of the SAC nitride layer 134 is exposed.

At the time of the CMP process, a High Selectivity Slurry (HSS) having less loss of the SAC nitride layer 134 or a Low Selectivity Slurry (LSS) having more loss of the SAC nitride layer 134 may be used. Alternatively, after the polishing process using the LSS, the remaining polishing process using the HSS may be performed. If the LSS is used solely, the SAC nitride layer 134 is lost greatly. Thus, the LSS is selectively used with respect to devices whose device characteristics are not influenced although part of the SAC nitride layer 134 is attached.

As described above, according to the first embodiment of the present invention, the oxide layer 116 is polished so that the surface roughnesses C, which have been transferred to the oxide layer 116 of the hard mask layer 112 during the secondary gate etch process of patterning the first conductive layer 104 before the SAC nitride layer 134 is deposited, are diminished. Accordingly, although the surface roughnesses A exist in the metal silicide layer 110, the SAC nitride layer 134 over the gate pattern 128 can be prevented from being lost fundamentally at the time of the polishing process of the pre-metal dielectric layer 136.

FIGS. 2A to 2E are sectional views illustrating a method of fabricating a flash memory device according to a second embodiment of the present invention.

Figure 2A:
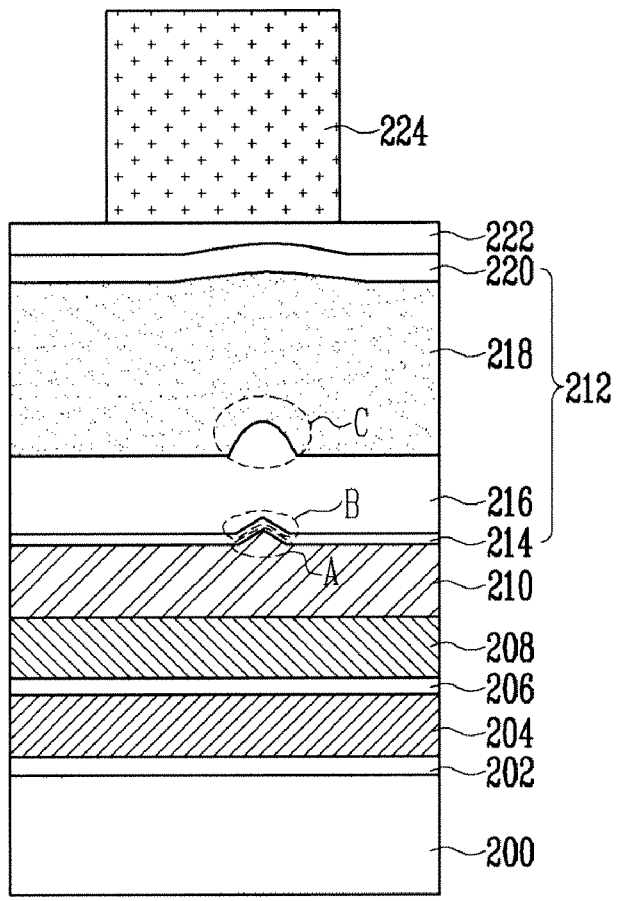
FIGS. 2A to 2E are sectional views illustrating a method of fabricating a flash memory device according to a second embodiment of the present invention.

Referring to FIG. 2A, a tunnel dielectric layer 202 and a first conductive layer 204 are formed over a semiconductor substrate 200. The tunnel dielectric layer 202 may be formed from a silicon oxide ($SiO_2$) layer using an oxidization process. The first conductive layer 204 is used as a floating gate of the flash memory device, and may be formed from a polysilicon layer, a metal layer or a stacked layer of them, preferably, a polysilicon layer.

The first conductive layer 204 of an active region is patterned in a first direction (a bit line direction) by performing an etch process employing a mask (not shown). Meanwhile, when the first conductive layer 204 is patterned in the active region, the first conductive layer 204, the tunnel dielectric layer 202 and the semiconductor substrate 200 of an isolation region are etched, thus forming trenches (not shown). An insulating material is deposited in order to gap fill the trenches and then is polished, thus forming isolation layers (not shown) within the trenches. The isolation layers may be formed using an ASA-STI process.

A dielectric layer 206 and a second conductive layer 208 are then formed over the patterned first conductive layer 204 and the isolation layer. The dielectric layer 206 may be formed using a stacked structure of ONO. The second conductive layer 208 is used as a control gate of the flash memory device, and may be formed from a polysilicon layer, a metal layer or a stacked layer of them, preferably, a polysilicon layer. The second conductive layer 208 is polished using an etchback process.

A metal silicide layer 210 and a hard mask layer 212 are formed over the second conductive layer 208. The metal silicide layer 210 is formed using a silicide process in order to lower the resistance of the control gate to be formed in a subsequent process, and may be formed from a tungsten silicide (WSix) layer. The tungsten silicide layer may be formed using the silicide process employing a MonoSilane (MS, $SiH_4$) or DiChloroSilane (DCS, $SiH_2Cl_2$) gas. At this time, the surface becomes rough in the process of forming the metal silicide layer 210 such as a tungsten silicide layer, so numerous roughnesses A are generated on the surface (for convenience' sake, only one roughness is shown in the drawing).

The hard mask layer 212 may have a stacked structure of two or more layers including a carbon-rich or oxygen-rich polymer-based material, in order to be used as an etch barrier layer in a subsequent gate etch process. The hard mask layer 212 may have a stacked structure of a buffer nitride layer 214, an oxide layer 216, an amorphous carbon layer 218 and a silicon oxynitride (SiON) layer 220. The buffer nitride layer 214 need not be necessarily formed and may be formed from a silicon oxynitride layer. The oxide layer 216 may be formed using any kinds of oxide-based materials, such as a TEOS oxide layer, a HTO layer and a HDP oxide layer. The oxide layer 216 may be formed to a thickness in a range of 500 to 4000 angstrom in order to compensate for the loss of the oxide layer 216 during a patterning process from the metal silicide layer 210 to the first conductive layer 204 in a subsequent gate etch process. At this time, the surface roughnesses A generated in the metal silicide layer 210 are transferred, so that surface roughnesses B, C are also generated on the surfaces of the buffer nitride layer 214 and the oxide layer 216, respectively, when the buffer nitride layer 214 and the oxide layer 216 are formed. In particular, the surface has a step due to the surface roughnesses C generated in the oxide layer 216.

However, the amorphous carbon layer 218 is thickly formed when compared with other layers and therefore the surface roughnesses C generated in the oxide layer 216 are diminished. Thus, surface roughness of the silicon oxynitride layer 220 is diminished.

Meanwhile, an ARC layer 222 may be further formed on the hard mask layer 212 in order to prevent total reflection of light in an exposure process when forming a photoresist pattern to be used as a gate mask in a subsequent gate etch process. A photoresist is coated on the ARC layer 222, thus forming a photoresist film. The photoresist film is exposed and developed in order to form a photoresist pattern 224.

Figure 2B:
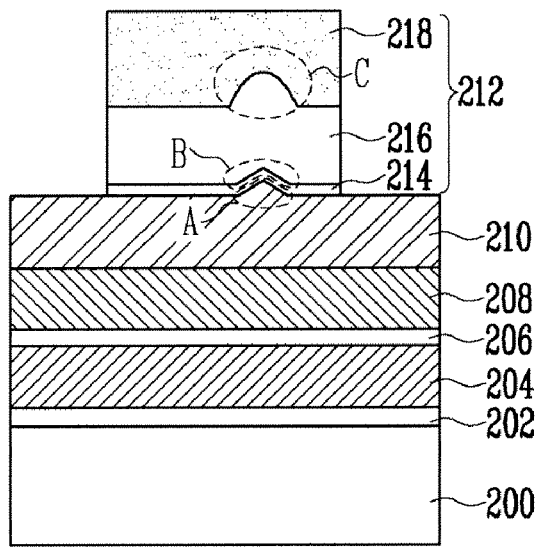

Referring to FIG. 2B, the ARC layer 222 and the hard mask layer 212 are patterned in a second direction (a word line direction) by performing a primary gate etch process employing the photoresist pattern 224 as an etch mask. The primary gate etch process may be performed using a dry or wet etchback process. In the primary gate etching process, the photoresist pattern 224, the ARC layer 222, and the silicon oxynitride layer 220 of the hard mask layer 212 are all etched and removed, and the amorphous carbon layer 218 of the hard mask layer 212 is partially etched. Meanwhile, when the photoresist pattern 224, the ARC layer 222 and the silicon oxynitride layer 220 remain after the primary gate etching, an etch process may be performed in order to remove them.

Figure 2C:
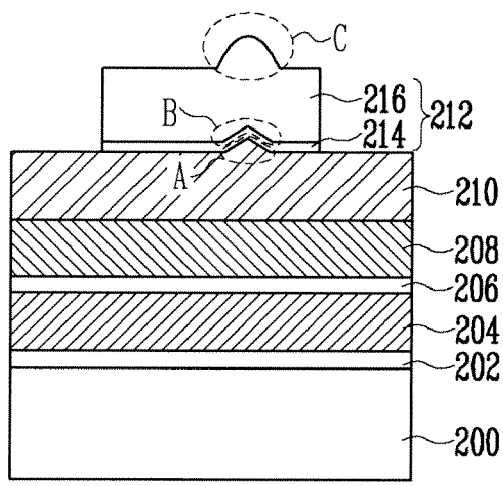

Referring to FIG. 2C, the remaining amorphous carbon layer 218 is selectively removed by performing an etch process. The amorphous carbon layer 218 may be removed in-situ or ex-situ after the primary gate etch process of patterning up to the hard mask layer 212. Accordingly, the surface of the oxide layer 216 of the hard mask layer 212 having the surface roughnesses C is exposed.

Figure 2D:
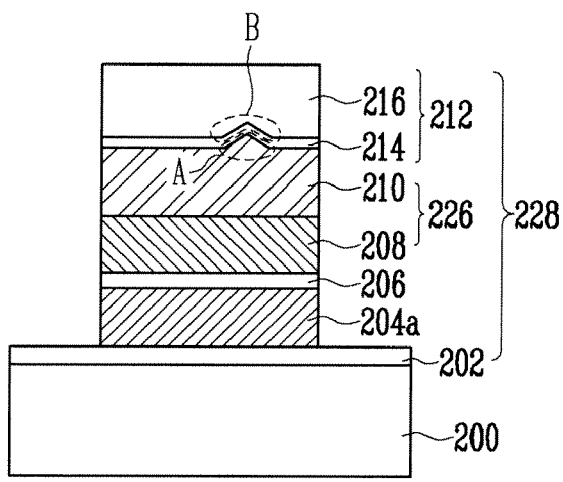

Referring to FIG. 2D, the metal silicide layer 210, the second conductive layer 208, the dielectric layer 206 and the first conductive layer 204 are patterned in a second direction (a word line direction) by performing a secondary gate etch process using the oxide layer 216 as an etch mask. The secondary gate etch process may be performed using a dry or wet etchback process.

The surface of the oxide layer 216 of the hard mask layer 212 is polished in order to diminish the surface roughnesses C generated in the oxide layer 216 of the hard mask layer 212 while patterning is performed from the metal silicide layer 210 to the first conductive layer 204.

The primary and secondary gate etch processes may be performed using a plasma etch equipment of a CCP type, an ICP type or a microwave plasma type.

After the secondary gate etch process is completed, a floating layer 204a including the first conductive layer 204 is formed, and a control gate 226 including the second conductive layer 208 and the metal silicide layer 210 is formed. Further, the surface roughnesses C generated on the surface of the oxide layer 216 are diminished, so the surface of the oxide layer 216 is polished.

Consequently, a gate pattern 228, comprising the tunnel dielectric layer 202, the floating gate 204a, the dielectric layer 206, the control gate 226, the buffer nitride layer 214 and the polished oxide layer 216, is formed.

Source/drain junction regions (not shown) are then formed in the semiconductor substrate 200 at both sides of the gate pattern 228 by performing an ion implantation process, thereby completing a transistor.

Figure 2E:
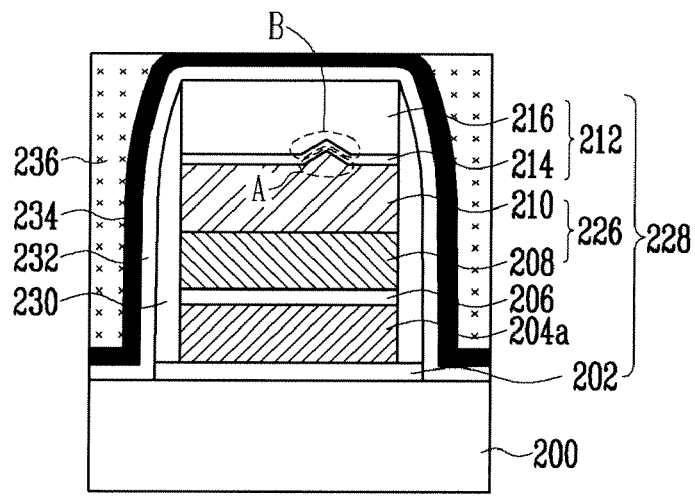

Referring to FIG. 2E, an insulating material is deposited on the gate pattern 228 including the polished oxide layer 216. Spacers 230 may be further formed on both sidewalls of the gate pattern 228 by performing a spacer etch process. When forming the spacers 230, the exposed tunnel dielectric layer 202 may be etched. Thereafter, a buffer insulating layer 232 may be further formed on the surface of the gate pattern 228 including the spacers 230.

A SAC nitride layer 234 is formed on the surface of the buffer insulating layer 232 in order to be used as a stopper during a subsequent polishing process of the pre-metal dielectric layer for forming a contact plug. The SAC nitride layer 234 may be formed from a nitride layer using a PECVD method or a LPCVD method. At this time, before the deposition of the SAC nitride layer 234, the oxide layer 216 of the hard mask layer 212 is polished. Accordingly, roughnesses are not generated on the surface of the SAC nitride layer 234.

An insulating material is then deposited on the SAC nitride layer 234, thus forming a pre-metal dielectric layer 236. The pre-metal dielectric layer 236 is etched and polished. The pre-metal dielectric layer 236 may be formed using any kinds of insulating materials, such as a TEOS oxide layer, a HTO layer and a HDP oxide layer. The polishing process may be performed using a CMP process. The polishing process may be performed until the surface of the SAC nitride layer 234 is exposed in order to improve uniformity with respect to the remaining thickness of the pre-metal dielectric layer 236. Alternatively, the polishing process may be performed a point before the surface of the SAC nitride layer 234 is exposed.

At the time of the CMP process, a HSS having less loss of the SAC nitride layer 234 or a LSS having more loss of the SAC nitride layer 234 may be used. Alternatively, after the polishing process using the LSS, the remaining polishing process using the HSS may be performed. If the LSS is used solely, the SAC nitride layer 234 is lost greatly. Thus, the LSS is selectively used with respect to devices whose device characteristics are not influenced although part of the SAC nitride layer 234 is attached.

As described above, according to the second embodiment of the present invention, the oxide layer 216 is polished in order to diminish the surface roughnesses C transferred to the oxide layer 216 of the hard mask layer 212 during the secondary gate etch process of performing patterning from the first conductive layer 204 to the first conductive layer 204 before the SAC nitride layer 234 is deposited. Accordingly, although the surface roughnesses A exist in the metal silicide layer 210, the SAC nitride layer 234 over the gate pattern 228 can be prevented from being lost fundamentally at the time of the polishing process of the pre-metal dielectric layer 236.

FIGS. 3A to 3E are sectional views illustrating a method of fabricating a flash memory device according to a third embodiment of the present invention.

Figure 3A:
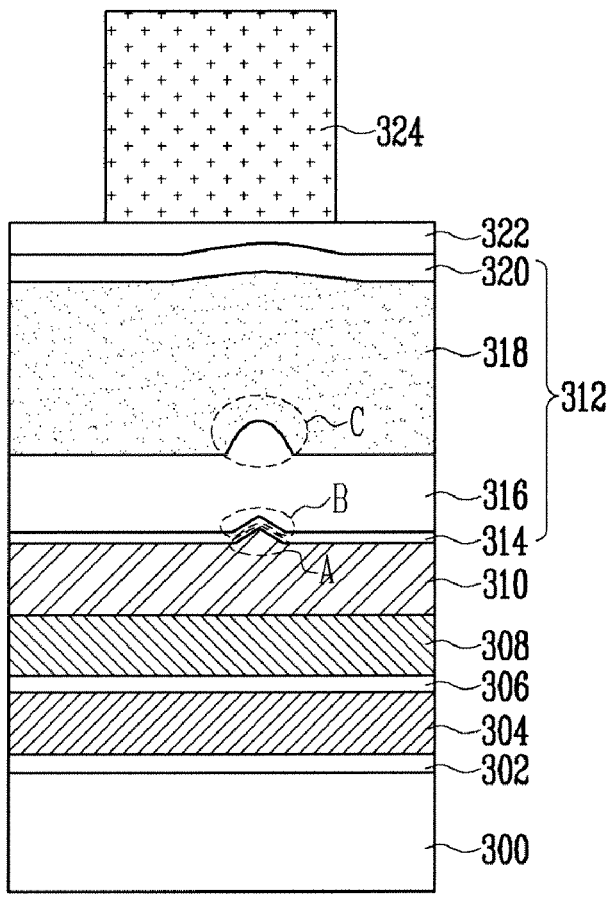
FIGS. 3A to 3E are sectional views illustrating a method of fabricating a flash memory device according to a third embodiment of the present invention.

Referring to FIG. 3A, a tunnel dielectric layer 302 and a first conductive layer 304 are formed over a semiconductor substrate 300. The tunnel dielectric layer 302 may be formed from a silicon oxide ($SiO_2$) layer using an oxidization process. The first conductive layer 304 is used as a floating gate of the flash memory device, and may be formed from a polysilicon layer, a metal layer or a stacked layer of them, preferably, a polysilicon layer.

The first conductive layer 304 of an active region is patterned in a first direction (a bit line direction) by performing an etch process employing a mask (not shown). Meanwhile, when the first conductive layer 304 is patterned in the active region, the first conductive layer 304, the tunnel dielectric layer 302 and the semiconductor substrate 300 of an isolation region are etched, thus forming trenches (not shown). An insulating material is deposited in order to gap fill the trenches and then is polished, thus forming isolation layers (not shown) within the trenches. The isolation layers may be formed using an ASA-STI process.

A dielectric layer 306 and a second conductive layer 308 are then formed over the patterned first conductive layer 304 and the isolation layer. The dielectric layer 306 may be formed using a stacked structure of ONO. The second conductive layer 308 is used as a control gate of the flash memory device, and may be formed from a polysilicon layer, a metal layer or a stacked layer of them, preferably, a polysilicon layer. The second conductive layer 308 preferably is polished using an etchback process.

A metal silicide layer 310 and a hard mask layer 312 are formed over the second conductive layer 308. The metal silicide layer 310 preferably is formed using a silicide process in order to lower the resistance of the control gate to be formed in a subsequent process, and may be formed from a tungsten silicide (WSix) layer. The tungsten silicide layer may be formed using the silicide process employing a MonoSilane (MS, $SiH_4$) or DiChloroSilane (DCS, $SiH_2Cl_2$) gas. At this time, the surface becomes rough in the process of forming the metal silicide layer 310 such as a tungsten silicide layer, so numerous roughnesses A are generated on the surface (for convenience' sake, only one roughness is shown in the drawing).

The hard mask layer 312 may have a stacked structure of two or more layers including a carbon-rich or oxygen-rich polymer-based material, in order to be used as an etch barrier layer in a subsequent gate etch process. The hard mask layer 312 may have a stacked structure of a buffer nitride layer 314, an oxide layer 316, an amorphous carbon layer 318 and a silicon oxynitride (SiON) layer 320. The buffer nitride layer 314 need not be necessarily formed and may be formed from a silicon oxynitride layer. The oxide layer 316 may be formed using any kinds of oxide-based materials, such as a TEOS oxide layer, a HTO layer and a HDP oxide layer. The oxide layer 316 may be formed to a thickness in a range of 500 to 3000 angstrom in order to compensate for the loss of the oxide layer 316 during a patterning process from the second conductive layer 308 to the first conductive layer 304 in a subsequent gate etch process. At this time, the surface roughnesses A generated in the metal silicide layer 310 are transferred, so that surface roughnesses B, C are also generated on the surfaces of the buffer nitride layer 314 and the oxide layer 316, respectively, when the buffer nitride layer 314 and the oxide layer 316 are formed. In particular, the surface has a step due to the surface roughnesses C generated in the oxide layer 316.

However, the amorphous carbon layer 318 is thickly formed when compared with other layers and therefore the surface roughnesses C generated in the oxide layer 316 are diminished. Thus, surface roughness of the silicon oxynitride layer 320 is diminished.

Meanwhile, an ARC layer 322 may be further formed on the hard mask layer 312 in order to prevent total reflection of light in an exposure process when forming a photoresist pattern to be used as a gate mask in a subsequent process. A photoresist is coated on the ARC layer 322, thus forming a photoresist film. The photoresist film is exposed and developed in order to form a photoresist pattern 324.

Figure 3B:
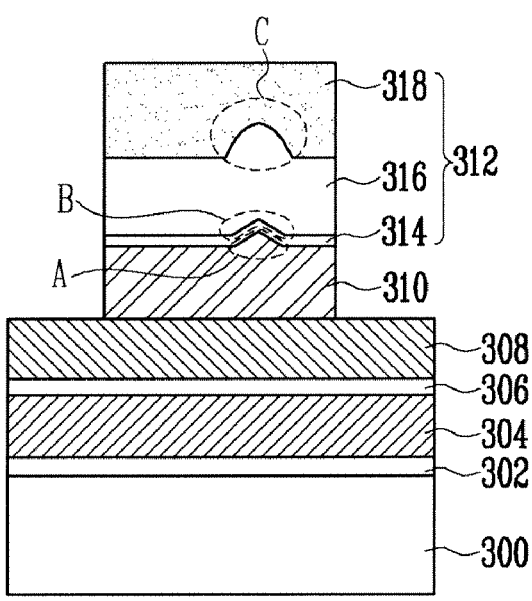

Referring to FIG. 3B, the ARC layer 322, the hard mask layer 312 and the metal silicide layer 310 are patterned in a second direction (a word line direction) by performing a primary gate etch process employing the photoresist pattern 324 as an etch mask. The primary gate etch process may be performed using a dry or wet etchback process. In the primary gate etching process, the photoresist pattern 324, the ARC layer 322, and the silicon oxynitride layer 320 of the hard mask layer 312 are all etched and removed, and the amorphous carbon layer 318 of the hard mask layer 312 is partially etched.

Figure 3C:
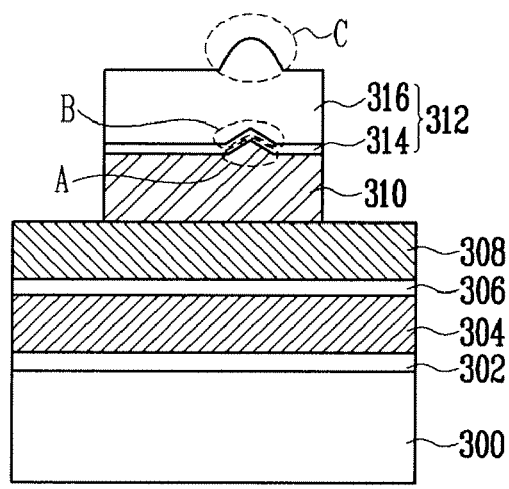

Referring to FIG. 3C, the remaining amorphous carbon layer 318 of the hard mask layer 312 is selectively removed by performing an etch process. The amorphous carbon layer 318 may be removed in-situ or ex-situ after the primary gate etch process of patterning up to the metal silicide layer 310. Accordingly, the surface of the oxide layer 316 of the hard mask layer 312 having the surface roughnesses C is exposed.

Figure 3D:
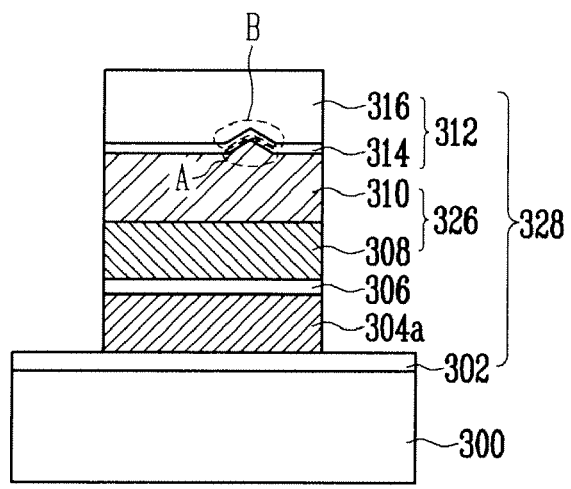

Referring to FIG. 3D, the second conductive layer 308, the dielectric layer 306 and the first conductive layer 304 are patterned in a second direction (a word line direction) by performing a secondary gate etch process using the oxide layer 316 as an etch mask. The secondary gate etch process may be performed using a dry or wet etchback process. At this time, the surface of the oxide layer 316 of the hard mask layer 312 is polished in order to diminish the surface roughnesses C generated in the oxide layer 316 of the hard mask layer 312 while the patterning process is performed from the first conductive layer 308 to the first conductive layer 304.

The primary and secondary gate etch processes may be performed using a plasma etch equipment of a CCP type, an ICP type or a microwave plasma type.

After the secondary gate etch process is completed, a floating gate 304a including the first conductive layer 304 is formed, and a control gate 326 including the second conductive layer 308 and the metal silicide layer 310 is formed. Further, the surface roughnesses C generated on the surface of the oxide layer 316 are diminished, so the surface of the oxide layer 316 is polished.

Consequently, a gate pattern 328, comprising the tunnel dielectric layer 302, the floating gate 304a, the dielectric layer 306, the control gate 326, the buffer nitride layer 314 and the polished oxide layer 316, is formed.

Source/drain junction regions (not shown) are then formed in the semiconductor substrate 300 at both sides of the gate pattern 328 by performing an ion implantation process, thereby completing a transistor.

Figure 3E:
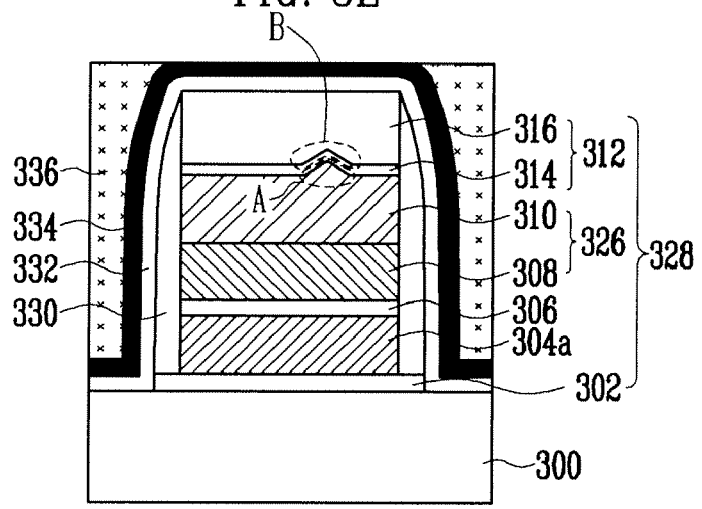

Referring to FIG. 3E, an insulating material is deposited on the gate pattern 328 including the polished oxide layer 316. Spacers 330 may be further formed on both sidewalls of the gate pattern 328 by performing a spacer etch process. When forming the spacers 330, the exposed tunnel dielectric layer 302 may be etched. Thereafter, a buffer insulating layer 332 may be further formed on the surface of the gate pattern 328 including the spacers 330.

A SAC nitride layer 334 is formed on the surface of the buffer insulating layer 332 in order to be used as a stopper during a subsequent polishing process of the pre-metal dielectric layer for forming a contact plug. The SAC nitride layer 334 may be formed from a nitride layer using a PECVD method or a LPCVD method. At this time, before the deposition of the SAC nitride layer 334, the oxide layer 316 of the hard mask layer 312 is polished. Accordingly, roughnesses are not generated on the surface of the SAC nitride layer 334.

An insulating material is then deposited on the SAC nitride layer 334, thus forming a pre-metal dielectric layer 336. The pre-metal dielectric layer 336 is etched and polished. The pre-metal dielectric layer 336 may be formed using any kinds of insulating materials, such as a TEOS oxide layer, a HTO layer and a HDP oxide layer. The polishing process may be performed using a CMP process. The polishing process may be performed until the surface of the SAC nitride layer 334 is exposed in order to improve uniformity with respect to the remaining thickness of the pre-metal dielectric layer 336. Alternatively, the polishing process may be performed until a point before the surface of the SAC nitride layer 334 is exposed.

At the time of the CMP process, a HSS having less loss of the SAC nitride layer 334 or a LSS having more loss of the SAC nitride layer 334 may be used. Alternatively, after the polishing process using the LSS, the remaining polishing process using the HSS may be performed. If the LSS is used solely, the SAC nitride layer 334 is lost greatly. Thus, the LSS is selectively used with respect to devices whose device characteristics are not influenced although part of the SAC nitride layer 334 is attached.

As described above, according to the third embodiment of the present invention, the oxide layer 316 is polished in order to diminish the surface roughnesses C transferred to the oxide layer 316 of the hard mask layer 312 during the secondary gate etch process of performing patterning from the second conductive layer 308 to the first conductive layer 304 before the SAC nitride layer 334 is deposited. Accordingly, although the surface roughnesses A exist in the metal silicide layer 310, the SAC nitride layer 334 over the gate pattern 328 can be prevented from being lost fundamentally at the time of the polishing process of the pre-metal dielectric layer 336.

FIGS. 4A to 4E are sectional views illustrating a method of fabricating a flash memory device according to a fourth embodiment of the present invention.

Figure 4A:
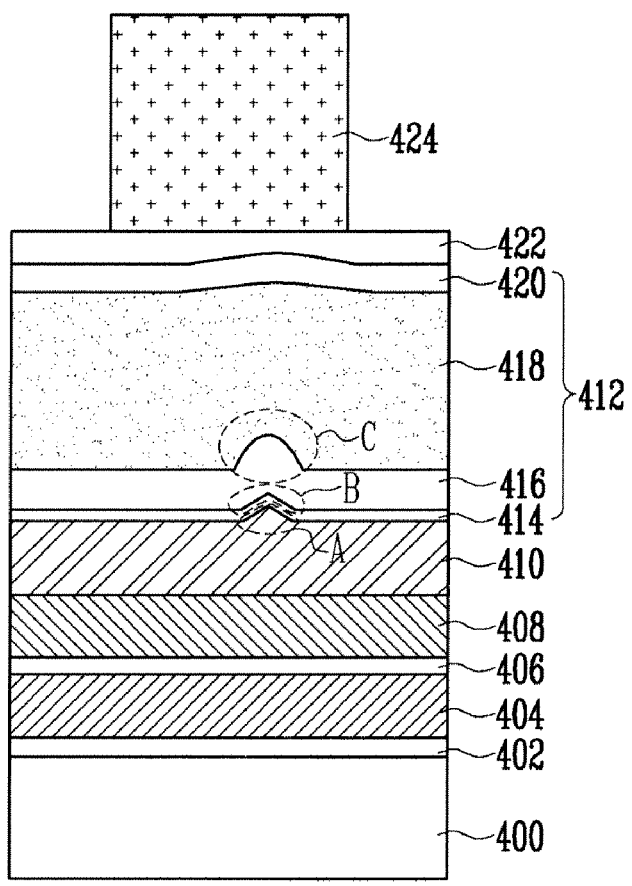
FIGS. 4A to 4E are sectional views illustrating a method of fabricating a flash memory device according to a fourth embodiment of the present invention.

Referring to FIG. 4A, a tunnel dielectric layer 402 and a first conductive layer 404 are formed over a semiconductor substrate 400. The tunnel dielectric layer 402 may be formed from a silicon oxide ($SiO_2$) layer using an oxidization process. The first conductive layer 404 is used as a floating gate of the flash memory device, and may be formed from a polysilicon layer, a metal layer or a stacked layer of them, preferably, a polysilicon layer.

The first conductive layer 404 of an active region is patterned in a first direction (a bit line direction) by performing an etch process employing a mask (not shown). Meanwhile, when the first conductive layer 404 is patterned in the active region, the first conductive layer 404, the tunnel dielectric layer 402 and the semiconductor substrate 400 of an isolation region are etched, thus forming trenches (not shown). An insulating material is deposited in order to gap fill the trenches and then polished, thus forming isolation layers (not shown) within the trenches. The isolation layers may be formed using an ASA-STI process.

A dielectric layer 406 and a second conductive layer 408 are then formed over the patterned first conductive layer 404 and the isolation layer. The dielectric layer 406 may be formed using a stacked structure of ONO. The second conductive layer 408 is used as a control gate of the flash memory device, and may be formed from a polysilicon layer, a metal layer or a stacked layer of them, preferably, a polysilicon layer. The second conductive layer 408 preferably is polished using an etchback process.

A metal silicide layer 410 and a hard mask layer 412 are formed over the second conductive layer 408. The metal silicide layer 410 is formed using a silicide process in order to lower the resistance of the control gate to be formed in a subsequent process, and may be formed from a tungsten silicide (WSix) layer. The tungsten silicide layer may be formed using the silicide process employing a MonoSilane (MS, $SiH_4$) or DiChloroSilane (DCS, $SiH_2Cl_2$) gas. At this time, the surface becomes rough in the process of forming the metal silicide layer 410 such as a tungsten silicide layer, so numerous roughnesses A are generated on the surface (for convenience' sake, only one roughness is shown in the drawing).

The hard mask layer 412 may have a stacked structure of two or more layers including a carbon-rich or oxygen-rich polymer-based material, in order to be used as an etch barrier layer in a subsequent gate etch process. The hard mask layer 412 may have a stacked structure of a buffer nitride layer 414, an oxide layer 416, an amorphous carbon layer 418 and a silicon oxynitride (SiON) layer 420. The buffer nitride layer 414 may not be necessarily formed and may be formed from a silicon oxynitride layer. The oxide layer 416 may be formed using any kinds of oxide-based materials, such as a TEOS oxide layer, a HTO layer and a HDP oxide layer. The oxide layer 416 may be formed to a thickness in a range of 500 to 3000 angstrom in order to compensate for the oxide layer 416, which is lost during a patterning process of the dielectric layer 406 and the first conductive layer 404 in a subsequent gate etch process. At this time, the surface roughnesses A generated in the metal silicide layer 410 are transferred, so that surface roughnesses B, C are also generated on the surfaces of the buffer nitride layer 414 and the oxide layer 416, respectively, when the buffer nitride layer 414 and the oxide layer 416 are formed. In particular, the surface has a step due to the surface roughnesses C generated in the oxide layer 416.

However, the amorphous carbon layer 418 is thickly formed when compared with other layers and therefore the surface roughnesses C generated in the oxide layer 416 are diminished. Thus, surface roughness of the silicon oxynitride layer 420 is diminished.

Meanwhile, an ARC layer 422 may be further formed on the hard mask layer 412 in order to prevent total reflection of light in an exposure process when forming a photoresist pattern to be used as a gate mask in a subsequent gate etch process. A photoresist is coated on the ARC layer 422, thus forming a photoresist film. The photoresist film is exposed and developed in order to form a photoresist pattern 424.

Figure 4B:
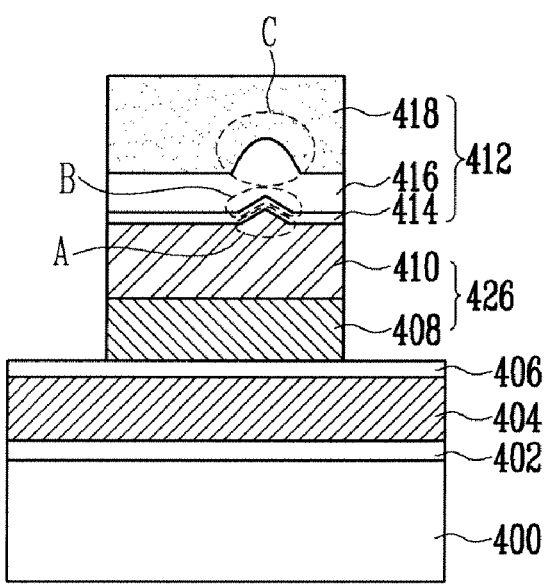

Referring to FIG. 4B, the ARC layer 422, the hard mask layer 412, the metal silicide layer 410 and the second conductive layer 408 are patterned in a second direction (a word line direction) by performing a primary gate etch process employing the photoresist pattern 424 as an etch mask. The primary gate etch process may be performed using a dry or wet etchback process.

Thus, after the gate etch process, a control gate 426, including the patterned second conductive layer 408 and the patterned metal silicide layer 410, is formed. Further, in the primary gate etching process, the photoresist pattern 424, the ARC layer 422, and the silicon oxynitride layer 420 of the hard mask layer 412 are all etched and removed, and the amorphous carbon layer 418 of the hard mask layer 412 is partially etched.

Figure 4C:
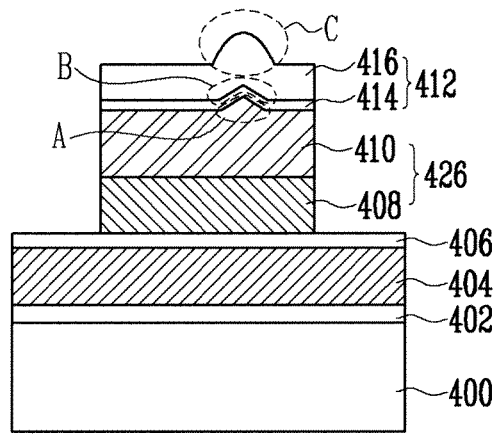

Referring to FIG. 4C, the remaining amorphous carbon layer 418 of the hard mask layer 412 is selectively removed by performing an etch process. The amorphous carbon layer 418 may be removed in-situ or ex-situ after the primary gate etch process for patterning up to the second conductive layer 408 is performed. Accordingly, the surface of the oxide layer 416 of the hard mask layer 412 having the surface roughnesses C is exposed.

Figure 4D:
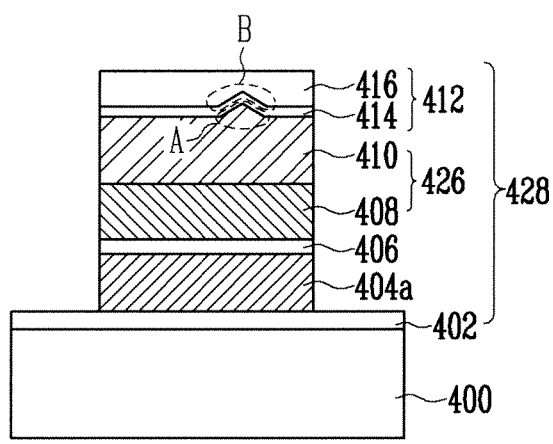

Referring to FIG. 4D, the dielectric layer 406 and the first conductive layer 404 are patterned in a second direction (a word line direction) by performing a secondary gate etch process using the oxide layer 416 as an etch mask. The secondary gate etch process may be performed using a dry or wet etchback process.

At this time, the surface of the oxide layer 416 of the hard mask layer 412 may be polished in order to diminish the surface roughnesses C generated in the oxide layer 416 of the hard mask layer 412 while the dielectric layer 406 and the first conductive layer 404 are patterned.

The primary and secondary gate etch processes may be performed using a plasma etch equipment of a CCP type, an ICP type or a microwave plasma type.

After the secondary gate etch process is completed, a floating gate 404a including the first conductive layer 404 is formed. Further, the surface roughnesses C generated on the surface of the oxide layer 416 are diminished, so the surface of the oxide layer 416 is polished.

Consequently, a gate pattern 428, comprising the tunnel dielectric layer 402, the floating gate 404a, the dielectric layer 406, the control gate 426, the buffer nitride layer 414 and the polished oxide layer 416, is formed.

Source/drain junction regions (not shown) are then formed in the semiconductor substrate 400 at both sides of the gate pattern 428 by performing an ion implantation process, thereby completing a transistor.

Figure 4E:
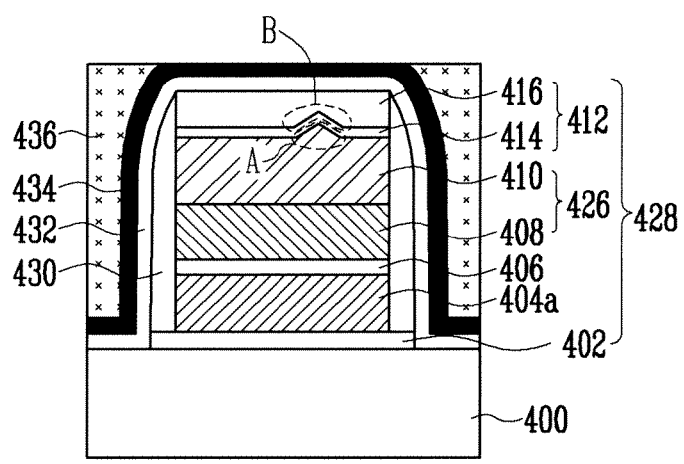

Referring to FIG. 4E, an insulating material is deposited on the gate pattern 428 including the polished oxide layer 416. Spacers 430 may be further formed on both sidewalls of the gate pattern 428 by performing a spacer etch process. When forming the spacers 430, the exposed tunnel dielectric layer 402 may be etched. Thereafter, a sidewall oxide 432 may be further formed on the surfaces of the spacers 430 and the gate pattern 428 by performing an oxidization process in order to compensate for loss caused by the etch process for forming the gate pattern 428.

A SAC nitride layer 434 is formed on the surface of the sidewall oxide 432 in order to protect the gate pattern 428 during a subsequent polishing process of the pre-metal dielectric layer for forming a contact plug. The SAC nitride layer 434 may be formed from a nitride layer using a PECVD method or a LPCVD method. At this time, before the deposition of the SAC nitride layer 434, the oxide layer 416 of the hard mask layer 412 is polished. Accordingly, roughnesses are not generated on the surface of the SAC nitride layer 434.

An insulating material is then deposited on the SAC nitride layer 434, thus forming a pre-metal dielectric layer 436. The pre-metal dielectric layer 436 is etched and polished. The pre-metal dielectric layer 436 may be formed using any kinds of insulating materials, such as a TEOS oxide layer, a HTO layer and a HDP oxide layer. The polishing process may be performed using a CMP process. The polishing process may be performed until the surface of the SAC nitride layer 434 is exposed in order to improve uniformity with respect to the remaining thickness of the pre-metal dielectric layer 436. Alternatively, the polishing process may be performed until a point before the surface of the SAC nitride layer 434 is exposed.

At the time of the CMP process, a HSS having less loss of the SAC nitride layer 434 or a LSS having more loss of the SAC nitride layer 434 may be used. Alternatively, after the polishing process using the LSS, the remaining polishing process using the HSS may be performed. If the LSS is used solely, the SAC nitride layer 434 is lost greatly. Thus, the LSS is selectively used with respect to devices whose device characteristics are not influenced although part of the SAC nitride layer 434 is attached.

As described above, according to the fourth embodiment of the present invention, the oxide layer 416 is polished in order to diminish the surface roughnesses C transferred to the oxide layer 416 of the hard mask layer 412 during the secondary gate etch process of patterning the dielectric layer 406 and the first conductive layer 404 before the SAC nitride layer 434 is deposited. Accordingly, although the surface roughnesses A exist in the metal silicide layer 410, the SAC nitride layer 434 over the gate pattern 428 can be prevented from being lost fundamentally at the time of the polishing process of the pre-metal dielectric layer 436.

FIGS. 5A to 5E are sectional views illustrating a method of fabricating a flash memory device according to a fifth embodiment of the present invention.

Figure 5A:
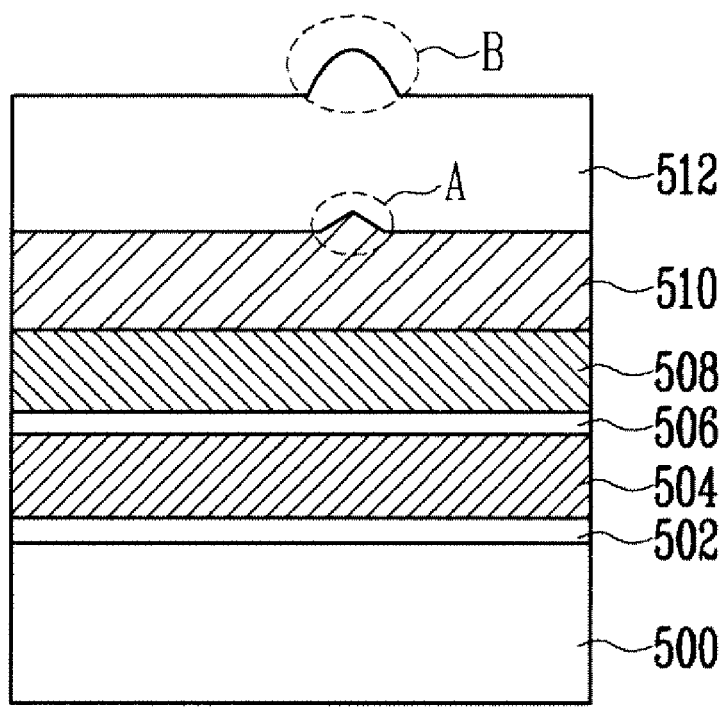
FIGS. 5A to 5E are sectional views illustrating a method of fabricating a flash memory device according to a fifth embodiment of the present invention.

Referring to FIG. 5A, a tunnel dielectric layer 502 and a first conductive layer 504 are formed over a semiconductor substrate 500. The tunnel dielectric layer 502 may be formed from a silicon oxide ($SiO_2$) layer using an oxidization process. The first conductive layer 504 is used as a floating gate of the flash memory device, and may be formed from a polysilicon layer, a metal layer or a stacked layer of them, preferably, a polysilicon layer.

The first conductive layer 504 of an active region is patterned in a first direction (a bit line direction) by performing an etch process employing a mask (not shown). Meanwhile, when the first conductive layer 504 is patterned in the active region, the first conductive layer 504, the tunnel dielectric layer 502 and the semiconductor substrate 500 of an isolation region are etched, thus forming trenches (not shown). An insulating material is deposited in order to gap fill the trenches and then polished, thus forming isolation layers (not shown) within the trenches. The isolation layers may be formed using an ASA-STI process.

A dielectric layer 506 and a second conductive layer 508 are then formed over the patterned first conductive layer 504 and the isolation layer. The dielectric layer 506 may be formed using a stacked structure of ONO. The second conductive layer 508 is used as a control gate of the flash memory device, and may be formed from a polysilicon layer, a metal layer or a stacked layer of them, preferably, a polysilicon layer. The second conductive layer 508 is polished using an etchback process.

A metal silicide layer 510 and a first hard mask layer 512 are formed over the second conductive layer 508. The metal silicide layer 510 is formed using a silicide process in order to lower the resistance of the control gate to be formed in a subsequent process, and may be formed from a tungsten silicide (WSix) layer. The tungsten silicide layer may be formed using the silicide process employing a MonoSilane (MS, $SiH_4$) or DiChloroSilane (DCS, $SiH_2Cl_2$) gas. At this time, the surface becomes rough in the process of forming the metal silicide layer 510 such as the tungsten silicide layer, so numerous roughnesses A are generated on the surface (for convenience' sake, only one roughness is shown in the drawing).

The first hard mask layer 512 is used as an etch barrier layer in a subsequent gate etch process, and may be formed from an oxide layer. The first hard mask layer 512 may be formed using any kinds of oxide-based materials, such as a TEOS oxide layer, a HTO layer and a HDP oxide layer. The first hard mask layer 512 may be formed to a thickness in a range of 1000 to 3000 angstrom. At this time, the surface roughnesses A generated in the metal silicide layer 510 are transferred, so that surface roughnesses B are also generated on the surfaces of the first hard mask layer 512 when first hard mask layer 512 is formed.

Figure 5B:
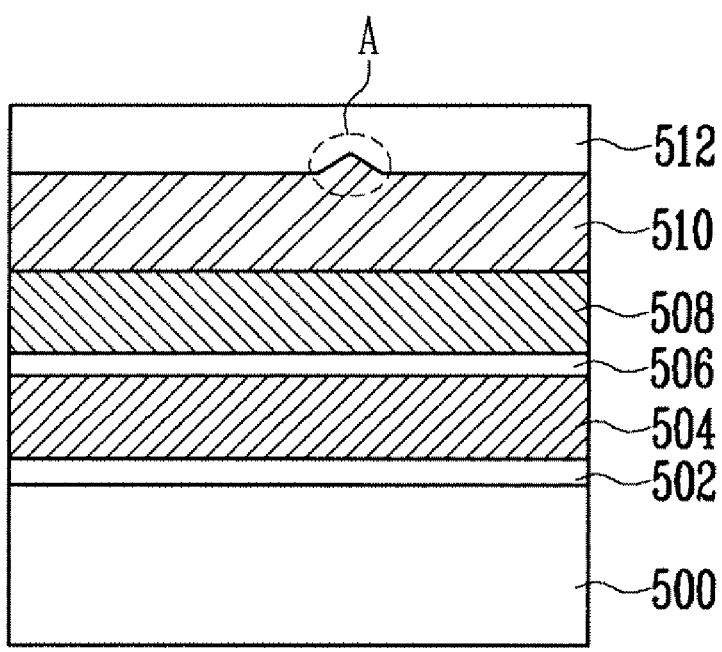

Referring to FIG. 5B, a polishing etch process is performed on the first hard mask layer 512 in order to diminish the surface roughnesses B of the first hard mask layer 512. The polishing etch process may be performed using an etchback process. Thus, the surface roughnesses B of the first hard mask layer 512 are diminished, so the surface of the first hard mask layer 512 is polished. Accordingly, a surface step of the first hard mask layer 512 is diminished. The etchback process may be performed using a dry or wet etch process. At this time, since the thickness of the first hard mask layer 512 is reduced by the etchback process, the first hard mask layer 512 is formed thickly in consideration of a reduced thickness. That is, the first hard mask layer 512 may be formed to a thickness in a range of 1000 to 3000 angstrom so that the first hard mask layer 512 having a target thickness remains even after the surface roughnesses B are removed by the etchback process.

Figure 5C:
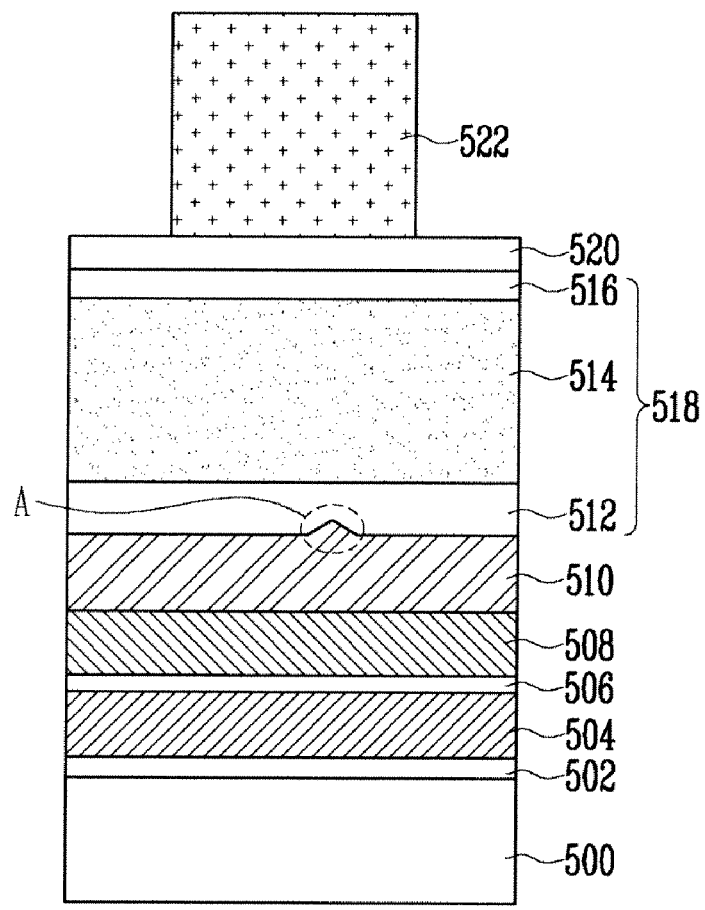

Referring to FIG. 5C, after the surface roughnesses B are diminished, a second hard mask layer 514 and a third hard mask layer 516 are formed over the polished first hard mask layer 512. The second hard mask layer 514 may be formed from an amorphous carbon layer. The third hard mask layer 516 may be formed from a silicon oxynitride layer. A hard mask layer 518, including the first, second and third hard mask layers 512, 514, and 516, is thereby formed. Surface roughness are not generated on the surfaces of the second and third hard mask layers 514 and 516 of the hard mask layer 518 due to the polished first hard mask layer 512. Thus, a step in each surface of the second and third hard mask layers 514 and 516 is diminished or avoided. Meanwhile, an ARC layer 520 may be further formed on the hard mask layer 518 in order to prevent total reflection of light in an exposure process when forming a photoresist pattern to be used as an etch mask in a subsequent gate etch process. A photoresist is coated on the ARC layer 520, thus forming a photoresist film. The photoresist film is exposed and developed, thus forming a photoresist pattern 522.

Figure 5D:
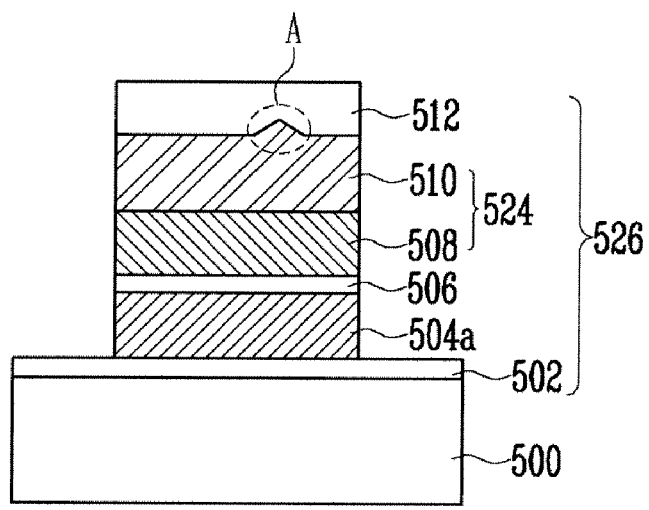

Referring to FIG. 5D, the ARC layer 520, and the third and second hard mask layers 516 and 514 of the hard mask layer 518 are patterned in a second direction (a word line direction) by performing a primary gate etch process using the photoresist pattern 522 as an etch mask. The photoresist pattern 522 and the ARC layer 520 are then removed.

The first hard mask layer 512, the metal silicide layer 510, the second conductive layer 508, the dielectric layer 506 and the first conductive layer 504 are then patterned in a second direction (a word line direction) by performing a secondary gate etch process using the patterned third and second hard mask layers 516 and 514 as an etch mask. In the secondary gate etching process, the third and second hard mask layers 516 and 514 may be removed. When the third and second hard mask layers 516 and 514 remain, they can be removed by performing an etch process.

The primary and secondary gate etch processes may be performed using a plasma etch equipment of a CCP type, an ICP type or a microwave plasma type.

Thus, a floating gate 504a consisting of the first conductive layer 504 is formed, and a control gate 524 including the second conductive layer 508 and the metal silicide layer 510 is formed. Further, a gate pattern 526, including the tunnel dielectric layer 502, the floating gate 504a, the dielectric layer 506, the control gate 524 and the first hard mask layer 512, is formed.

Alternatively, after the ARC layer 520, and the third, second and first hard mask layers 516, 514 and 512 of the hard mask layer 518 are patterned in a second direction (a word line direction) by performing the primary gate etch process using the photoresist pattern 522 as an etch mask, the photoresist pattern 522, the ARC layer 520, and the third and second hard mask layers 516 and 514 may be removed. Thereafter, the metal silicide layer 510, the second conductive layer 508, the dielectric layer 506 and the first conductive layer 504 may be patterned in a second direction (a word line direction) by performing the secondary gate etch process using the patterned first hard mask layer 512 as an etch mask. Accordingly, the gate pattern 526, including the tunnel dielectric layer 502, the floating gate 504a, the dielectric layer 506, the control gate 524 and the first hard mask layer 512, may be formed.

Source/drain junction regions (not shown) are then formed in the semiconductor substrate 500 at both sides of the gate pattern 526 by performing an ion implantation process, thereby completing a transistor.

Figure 5E:
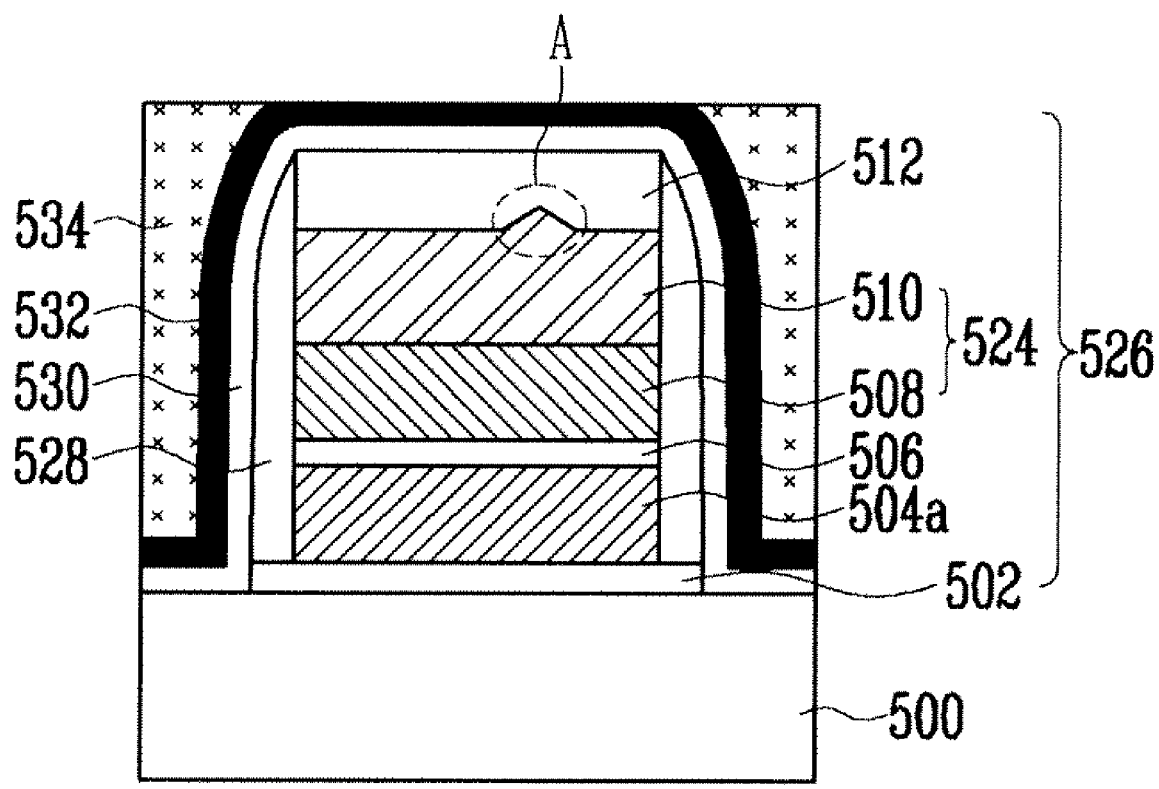

Referring to FIG. 5E, after an insulating material is deposited on the gate pattern 526 including the polished first hard mask layer 512, spacers 528 may be further formed on both sidewalls of the gate pattern 526 by performing a spacer etch process. When forming the spacers 528, the exposed tunnel dielectric layer 502 may be etched. Thereafter, a buffer insulating layer 530 may be further formed on the surface of the gate pattern 526 including the spacers 528.

A SAC nitride layer 532 is formed on the surface of the buffer insulating layer 530 in order to be used as a stopper in a subsequent polishing process of the pre-metal dielectric layer, for forming a contact plug. The SAC nitride layer 532 may be formed from a nitride layer using a PECVD method or a LPCVD method. At this time, the surface of the first hard mask layer 512, having the surface roughnesses B, is polished using an etchback process before the SAC nitride layer 532 is deposited. Accordingly, roughnesses are not generated on the surface of the SAC nitride layer 532.

An insulating material is then deposited on the SAC nitride layer 532, thus forming a pre-metal dielectric layer 534. The pre-metal dielectric layer 534 is etched and polished. The pre-metal dielectric layer 534 may be formed using any kinds of insulating materials, such as a TEOS oxide layer, a HTO layer and a HDP oxide layer. The polishing process may be performed using a CMP process. The polishing process may be performed until the surface of the SAC nitride layer 532 is exposed in order to improve uniformity with respect to the remaining thickness of the pre-metal dielectric layer 534. Alternatively, the polishing process may be performed until a point before the surface of the SAC nitride layer 532 is exposed.

At the time of the CMP process, a HSS having less loss of the SAC nitride layer 532 or a LSS having more loss of the SAC nitride layer 532 may be used. Alternatively, after the polishing process using the LSS, the remaining polishing process using the HSS may be performed. If the LSS is used solely, the SAC nitride layer 532 is lost greatly. Thus, the LSS is selectively used with respect to devices whose device characteristics are not influenced although part of the SAC nitride layer 532 is attached.

As described above, according to the fifth embodiment of the present invention, the first hard mask layer 512 is polished in order to diminish the surface roughnesses B transferred to the first hard mask layer 512 before the gate etch process is performed. Accordingly, although the surface roughnesses A exist in the metal silicide layer 510, surface roughnesses are rarely generated in the SAC nitride layer 532. Thus, the SAC nitride layer 532 over the gate pattern 526 can be prevented from being lost fundamentally at the time of the polishing process of the pre-metal dielectric layer 534.

As described above, according to the first to fifth embodiments of the present invention, although surface roughnesses exist in the metal silicide layer, the hard mask layer to which the surface roughnesses have been transferred is polished before or during the gate etch process. Thus, the SAC nitride layer over the gate can be prevented from being lost at the time of a polishing process of the pre-metal dielectric layer. Thus, a hump phenomenon of a transistor, which is generated since impurities, such as hydrogen ($H_2$), are infiltrated below the gate through lost portions of the SAC nitride layer, thereby degrading the tunnel dielectric layer, as in the prior art, can be prevented. Accordingly, a leakage current characteristic of the transistor and well stress fail can be improved, and the yield and reliability of devices can be improved accordingly.

Further, according to the present invention, a stop-on-nitride process of the CMP process of the SAC nitride layer can be secured stably. Accordingly, CMP uniformity with respect to the semiconductor substrate can be enhanced significantly. Consequently, overetch margin in subsequent etch processes of a source contact, a drain contact, a metal contact, etc. can be increased.

For convenience of description, in the present invention, a hump characteristic has been described in relation to a method of fabricating a memory cell of a flash memory device. However, the present invention can also be applied to a high voltage or low voltage transistor of a peripheral region in order to improve the hump characteristic of the high voltage or low voltage transistor.

The present invention is not limited to the disclosed embodiments, but may be implemented in various manners. The embodiments are provided to complete the disclosure of the present invention. The present invention is defined by the category of the claims.

What is claimed is:

1. A method of fabricating a flash memory device, the method comprising:
    providing a semiconductor substrate in which a tunnel dielectric layer, a first conductive layer, a dielectric layer, a second conductive layer, a metal silicide layer, and a hard mask layer are sequentially formed;
    patterning the hard mask layer, the metal silicide layer, the second conductive layer, and the dielectric layer;
    polishing the hard mask layer while patterning the first conductive layer;
    forming a Self-Aligned Contact (SAC) nitride layer and a pre-metal dielectric layer over a gate pattern including the polished hard mask layer; and
    performing an etch process for polishing the pre-metal dielectric layer.

2. The method of claim 1, comprising forming each of the first conductive layer and the second conductive layer from a polysilicon layer.

3. The method of claim 1, wherein the dielectric layer comprises a stacked structure comprising an oxide layer, a nitride layer and an oxide layer (ONO).

4. The method of claim 1, wherein the metal silicide layer comprises a tungsten silicide ($WSi_x$) layer.

5. The method of claim 4, comprising forming the tungsten silicide ($WSi_x$) layer using a silicide process employing a MonoSilane ($SiH_4$) or DiChloroSilane ($SiH_2Cl_2$) gas.

6. The method of claim 1, wherein the hard mask layer comprises a stacked structure of two or more layers comprising a carbon-rich or oxygen-rich polymer-based material.

7. The method of claim 1, wherein the hard mask layer comprises a stacked structure comprising an oxide layer, an amorphous carbon layer and a silicon oxynitride layer.

8. The method of claim 1, comprising patterning the first conductive layer through a plasma etch process comprising a main etch process and an overetch process.

9. The method of claim 8, wherein the main etch process comprises a first process using a bias power in a range of 200 W to 1500 W and a second process using a bias power in a range of 100 W to 700 W.

10. The method of claim 8, comprising performing the overetch process using a bias power in a range of 100 W to 700 W.

11. The method of claim 8, comprising polishing the hard mask layer in the first process of the main etch process.

12. The method of claim 7, further comprising removing the amorphous carbon layer in-situ or ex-situ after patterning the dielectric layer.

13. The method of claim 1, comprising polishing the hard mask layer while patterning the first conductive layer using a dry etch or wet etch etchback process.

14. The method of claim 1, comprising patterning the gate pattern using a plasma etch equipment of a Capacitively Coupled Plasma (CCP) type, an Inductively Coupled Plasma (ICP) type or a microwave plasma type.

15. The method of claim 1, comprising forming the SAC nitride layer using a Plasma-Enhanced Chemical Vapor Deposition (PECVD) method or a Low Pressure Chemical Vapor Deposition (LPCVD) method.

16. The method of claim 1, comprising performing the etch process of the pre-metal dielectric layer using a Chemical Mechanical Polishing (CMP) process.

17. The method of claim 16, comprising performing the CMP process until a surface of the SAC nitride layer is exposed, or until the SAC nitride layer is not exposed.

18. The method of claim 16, comprising performing the CMP process using a High Selectivity Slurry (HSS) having less loss of the SAC nitride layer or a Low Selectivity Slurry (LSS) having more loss of the SAC nitride layer.

19. The method of claim 1, further comprising forming spacers on sidewalls of the gate pattern before forming the SAC nitride layer.

20. A method of fabricating a flash memory device, the method comprising:
    providing a semiconductor substrate in which a tunnel dielectric layer, a first conductive layer, a dielectric layer, a second conductive layer, a metal silicide layer and a hard mask layer are sequentially formed;
    patterning the hard mask layer;
    patterning the metal silicide layer, the second conductive layer, the dielectric layer and the first conductive layer while polishing the hard mask layer in order to diminish surface roughnesses generated in the hard mask layer;
    forming a SAC nitride layer and a pre-metal dielectric layer over a gate pattern including the polished hard mask layer; and
    performing an etch process for polishing the pre-metal dielectric layer.

21. The method of claim 20, comprising forming each of the first conductive layer and the second conductive layer from a polysilicon layer.

22. The method of claim 20, wherein the dielectric layer has a stacked structure comprising an oxide layer, a nitride layer and an oxide layer (ONO).

23. The method of claim 20, comprising forming the metal silicide layer from a tungsten silicide ($WSi_x$) layer.

24. The method of claim 23, comprising forming the tungsten silicide ($WSi_x$) layer using a silicide process employing a MonoSilane ($SiH_4$) or DiChloroSilane ($SiH_2Cl_2$) gas.

25. The method of claim 20, wherein the hard mask layer has a stacked structure comprising two or more layers comprising a carbon-rich or oxygen-rich polymer-based material.

26. The method of claim 20, wherein the hard mask layer has a stacked structure comprising an oxide layer, an amorphous carbon layer and a silicon oxynitride layer.

27. The method of claim 26, comprising forming the oxide layer to a thickness in a range of 500 angstrom to 4000 angstrom.

28. The method of claim 26, comprising forming the oxide layer from a Tetra Ethyl Ortho Silicate (TEOS) oxide layer, a High Temperature Oxide (HTO) layer or a High Density Plasma (HDP) oxide layer.

29. The method of claim 26, comprising removing the amorphous carbon layer in-situ or ex-situ after patterning the hard mask layer.

30. The method of claim 20, comprising patterning the metal silicide layer, the second conductive layer and the first conductive layer while polishing the hard mask layer using a dry etch or wet etch etchback process.

31. The method of claim 20, comprising patterning the gate pattern using plasma etch equipment of a Capacitively Coupled Plasma (CCP) type, an Inductively Coupled Plasma (ICP) type or a microwave plasma type.

32. The method of claim 20, comprising forming the SAC nitride layer using a Plasma-Enhanced Chemical Vapor Deposition (PECVD) method or a Low Pressure Chemical Vapor Deposition (LPCVD) method.

33. The method of claim 20, comprising performing the etch process of the pre-metal dielectric layer using a Chemical Mechanical Polishing (CMP) process.

34. The method of claim 33, comprising performing the CMP process until a surface of the SAC nitride layer is exposed or until the SAC nitride layer is not exposed.

35. The method of claim 33, wherein the CMP process is performed using a High Selectivity Slurry (HSS) having less loss of the SAC nitride layer or a Low Selectivity Slurry (LSS) having more loss of the SAC nitride layer.

36. The method of claim 20, further comprising forming spacers on sidewalls of the gate pattern before forming the SAC nitride layer.

37. A method of fabricating a flash memory device, the method comprising:
providing a semiconductor substrate in which a tunnel dielectric layer, a first conductive layer, a dielectric layer, a second conductive layer, a metal silicide layer and a hard mask layer are sequentially formed;
patterning the hard mask layer and the metal silicide layer;
patterning the second conductive layer, the dielectric layer and the first conductive layer while polishing the hard mask layer in order to diminish surface roughnesses generated in the hard mask layer;
forming a SAC nitride layer and a pre-metal dielectric layer over a gate pattern including the polished hard mask layer; and
performing an etch process for polishing the pre-metal dielectric layer.

38. The method of claim 37, comprising forming each of the first conductive layer and the second conductive layer from a polysilicon layer.

39. The method of claim 37, wherein the dielectric layer has a stacked structure comprising an oxide layer, a nitride layer and an oxide layer (ONO).

40. The method of claim 37, comprising forming the metal silicide layer from a tungsten silicide ($WSi_x$) layer.

41. The method of claim 40, comprising forming the tungsten silicide ($WSi_x$) layer using a silicide process employing a MonoSilane ($SiH_4$) or DiChloroSilane ($SiH_2Cl_2$) gas.

42. The method of claim 37, wherein the hard mask layer has a stacked structure of two or more layers comprising a carbon-rich or oxygen-rich polymer-based material.

43. The method of claim 37, wherein the hard mask layer has a stacked structure comprising an oxide layer, an amorphous carbon layer and a silicon oxynitride layer.

44. The method of claim 43, comprising forming the oxide layer to a thickness in a range of 500 angstrom to 3000 angstrom.

45. The method of claim 43, comprising forming the oxide layer from a TEOS oxide layer, a HTO layer or a HDP oxide layer.

46. The method of claim 43, comprising removing the amorphous carbon layer in-situ or ex-situ after patterning the metal silicide layer or the second conductive layer.

47. The method of claim 37, comprising patterning the second conductive layer, the dielectric layer, and the first conductive layer while polishing the hard mask layer using a dry etch or wet etch etchback process.

48. The method of claim 37, comprising patterning the gate pattern using plasma etch equipment of a Capacitively Coupled Plasma (CCP) type, an Inductively Coupled Plasma (ICP) type or a microwave plasma type.

49. The method of claim 37, comprising forming the SAC nitride layer using a Plasma-Enhanced Chemical Vapor Deposition (PECVD) method or a Low Pressure Chemical Vapor Deposition (LPCVD) method.

50. The method of claim 37, comprising performing the etch process of the pre-metal dielectric layer using a Chemical Mechanical Polishing (CMP) process.

51. The method of claim 50, wherein the CMP process is performed until a surface of the SAC nitride layer is exposed, or until the SAC nitride layer is not exposed.

52. The method of claim 50, comprising performing the CMP process using a High Selectivity Slurry (HSS) having less loss of the SAC nitride layer or a Low Selectivity Slurry (LSS) having more loss of the SAC nitride layer.

53. The method of claim 37, further comprising forming spacers on sidewalls of the gate pattern before forming the SAC nitride layer.

54. A method of fabricating a flash memory device, the method comprising:
providing a semiconductor substrate in which a tunnel dielectric layer, a first conductive layer, a dielectric layer, a second conductive layer, a metal silicide layer and a hard mask layer are sequentially formed;
patterning the hard mask layer, the metal silicide layer and the second conductive layer;
patterning the dielectric layer and the first conductive layer while polishing the hard mask layer in order to diminish surface roughnesses generated in the hard mask layer;
forming a SAC nitride layer and a pre-metal dielectric layer over a gate pattern including the polished hard mask layer; and
performing an etch process for polishing the pre-metal dielectric layer.

55. The method of claim 54, wherein each of the first conductive layer and the second conductive layer is formed from a polysilicon layer.

56. The method of claim 54, wherein the dielectric layer has a stacked structure comprising an oxide layer, a nitride layer and an oxide layer (ONO).

57. The method of claim 54, comprising forming the metal silicide layer from a tungsten silicide ($WSi_x$) layer.

58. The method of claim 57, comprising forming the tungsten silicide ($WSi_x$) layer using a silicide process employing a MonoSilane ($SiH_4$) or DiChloroSilane ($SiH_2Cl_2$) gas.

59. The method of claim 54, wherein the hard mask layer has a stacked structure comprising two or more layers comprising a carbon-rich or oxygen-rich polymer-based material.

60. The method of claim 54, wherein the hard mask layer has a stacked structure comprising an oxide layer, an amorphous carbon layer and a silicon oxynitride layer.

61. The method of claim 60, comprising forming the oxide layer to a thickness in a range of 500 angstrom to 3000 angstrom.

62. The method of claim 60, comprising forming the oxide layer from a TEOS oxide layer, a HTO layer or a HDP oxide layer.

63. The method of claim 60, comprising removing the amorphous carbon layer in-situ or ex-situ after patterning the metal silicide layer or the second conductive layer.

64. The method of claim 54, comprising patterning the dielectric layer and the first conductive layer while polishing the hard mask layer using a dry etch or wet etch etchback process.

65. The method of claim 54, comprising patterning the gate pattern using plasma etch equipment of a Capacitively Coupled Plasma (CCP) type, an Inductively Coupled Plasma (ICP) type or a microwave plasma type.

66. The method of claim 54, comprising forming the SAC nitride layer using a Plasma-Enhanced Chemical Vapor Deposition (PECVD) method or a Low Pressure Chemical Vapor Deposition (LPCVD) method.

67. The method of claim 54, comprising performing the etch process of the pre-metal dielectric layer using a Chemical Mechanical Polishing (CMP) process.

68. The method of claim 67, comprising performing the CMP process until a surface of the SAC nitride layer is exposed or until the SAC nitride layer is not exposed.

69. The method of claim 67, comprising performing the CMP process using a High Selectivity Slurry (HSS) having less loss of the SAC nitride layer or a Low Selectivity Slurry (LSS) having more loss of the SAC nitride layer.

70. The method of claim 54, further comprising forming spacers on sidewalls of the gate pattern before forming the SAC nitride layer.

71. A method of fabricating a flash memory device, the method comprising:
   forming a hard mask layer over a semiconductor substrate in which a stacked structure comprising a conductive layer and a metal silicide layer, is formed;
   patterning the hard mask layer and the metal silicide layer;
   patterning the conductive layer while polishing the hard mask layer in order to diminish surface roughnesses generated in the hard mask layer;
   forming a SAC nitride layer and a pre-metal dielectric layer over a gate pattern including the polished hard mask layer; and
   performing an etch process for polishing the pre-metal dielectric layer.

72. A method of fabricating a flash memory device, the method comprising:
   forming a hard mask layer over a semiconductor substrate in which a stacked structure comprising a conductive layer and a metal silicide layer, is formed;
   patterning the hard mask layer;
   patterning the metal silicide layer and the conductive layer while polishing the hard mask layer in order to diminish surface roughnesses generated in the hard mask layer;
   forming a SAC nitride layer and a pre-metal dielectric layer over a gate pattern including the polished hard mask layer; and
   performing an etch process for polishing the pre-metal dielectric layer.

* * * * *